United States Patent [19]
El-Diwany

[11] Patent Number: 5,953,599
[45] Date of Patent: Sep. 14, 1999

[54] METHOD FOR FORMING LOW-VOLTAGE CMOS TRANSISTORS WITH A THIN LAYER OF GATE OXIDE AND HIGH-VOLTAGE CMOS TRANSISTORS WITH A THICK LAYER OF GATE OXIDE

[75] Inventor: Monir El-Diwany, Saratoga, Calif.

[73] Assignee: National Semiconductor Corporation, Santa Clara, Calif.

[21] Appl. No.: 08/873,822

[22] Filed: Jun. 12, 1997

[51] Int. Cl.$^6$ .................... H01L 21/8238; H01L 21/8234
[52] U.S. Cl. .................. 438/199; 438/210; 438/238; 438/275
[58] Field of Search ........................ 438/199, 200, 438/275, 258, 210, 216, 238, FOR 220, FOR 216; 257/392, 393; 148/DIG. 163

[56] References Cited

U.S. PATENT DOCUMENTS

| | | | |
|---|---|---|---|
| 5,304,503 | 4/1994 | Yoon et al. | 438/258 |
| 5,432,114 | 7/1995 | O | 438/217 |
| 5,468,666 | 11/1995 | Chapman | 438/238 |
| 5,489,547 | 2/1996 | Erdeljac et al. | 438/238 |
| 5,716,863 | 2/1998 | Arai | 438/275 |
| 5,723,355 | 3/1998 | Chang et al. | 438/275 |
| 5,759,887 | 6/1998 | Ito et al. | 438/554 |

FOREIGN PATENT DOCUMENTS 3-270167  12/1991  Japan .......................... 438/FOR 216

*Primary Examiner*—Michael Trinh
*Attorney, Agent, or Firm*—Limbach & Limbach L.L.P.

[57] ABSTRACT

The low-voltage, e.g., 2.5-volt, transistors that support the logic operations of a CMOS device are formed to have a thin layer of gate oxide, while the high-voltage, e.g., 3.3 or 5-volt, transistors that support the analog operations of the device are formed to have a thick layer of gate oxide in a cost-effective process flow that requires only one additional masking step over a conventional double-poly CMOS process.

13 Claims, 4 Drawing Sheets

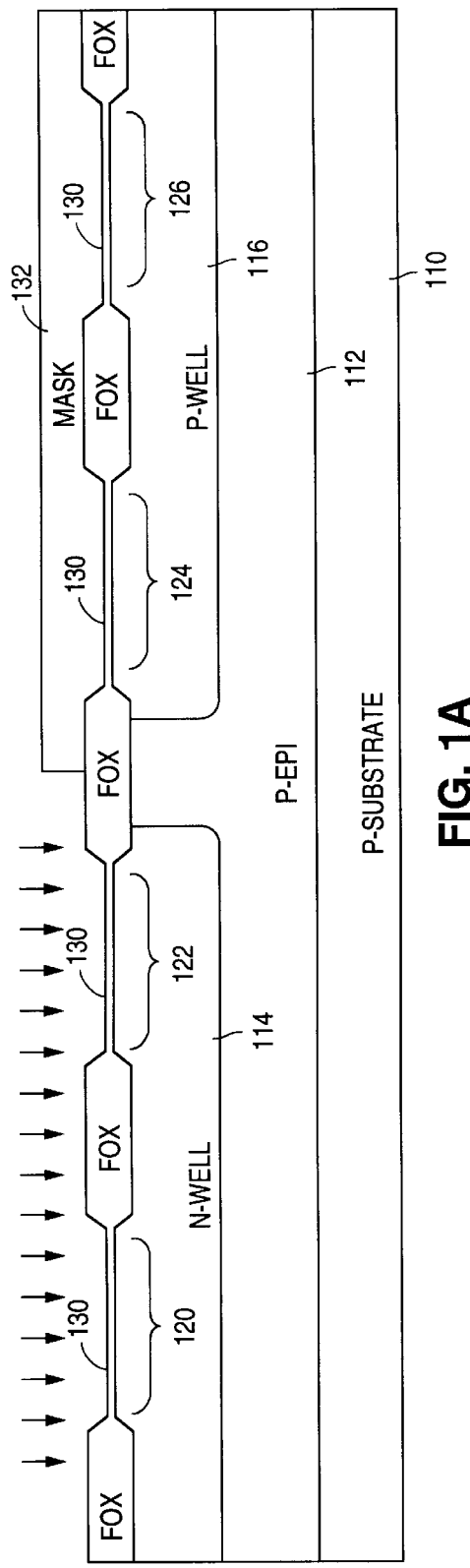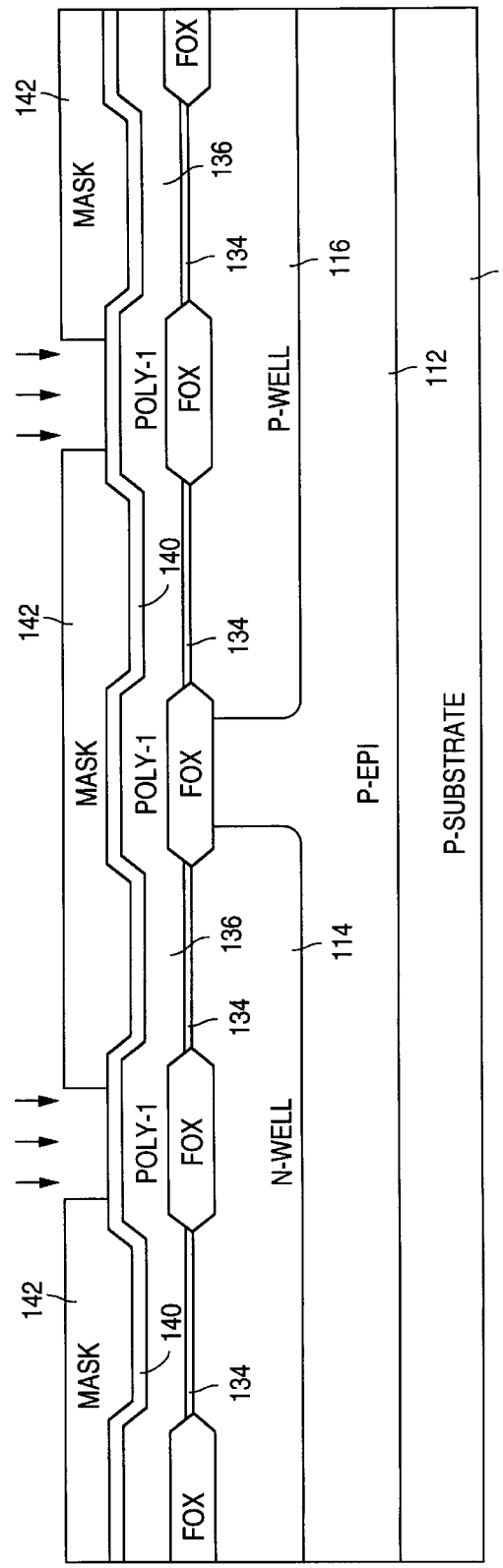

METHOD FOR FORMING LOW-VOLTAGE CMOS TRANSISTORS WITH A THIN LAYER OF GATE OXIDE AND HIGH-VOLTAGE CMOS TRANSISTORS WITH A THICK LAYER OF GATE OXIDE

BACKGROUND OF THE INVENTION

1. Field of the Invention

The present invention relates to a method for forming CMOS devices and, more particularly, to a cost effective method for forming low-voltage CMOS transistors with a thin layer of gate oxide, and high-voltage CMOS transistors with a thick layer of gate oxide.

2. Description of the Related Art

Current-generation 0.25-micron MOS transistors are an example of the continuing miniaturization of MOS transistors which have fallen in size from the micron range to the low submicron range in a few short years.

The advantages of utilizing ever smaller MOS transistors are that these devices reduce the cost of providing logic functions due to the increased number of transistors that can be integrated into a single package, and extend the life of battery-operated devices due to the lower voltage requirements of the smaller transistors.

One problem with utilizing current-generation 0.25-micron transistors, however, is that these transistors often function poorly when required to provide analog and mixed-signal functions due to the higher leakage currents and smaller dynamic ranges of these transistors.

With digital transistors, higher leakage currents contribute to increased power dissipation whereas leakage currents in analog transistors are particularly problematic in that these currents may render some analog circuits completely non-functional or lead to random errors. The higher leakage currents in deep sub-micron processes is attributed to non-complete turn-off of the transistors due to the low threshold voltages. This is particularly true for very short channel transistors.

With respect to the dynamic range, current-generation 0.25 micron devices typically operate off of a 2.5-volt supply voltage, whereas previous generation 0.35 and 0.5 micron devices commonly operated off of 3.3 and 5-volt supply voltages, respectively. Thus, current-generation MOS transistors provide approximately two-thirds to one-half of the dynamic range of the older devices.

One solution to this problem is to utilize the 0.25-micron transistors when implementing the digital functions of a circuit, and the 0.35 or 0.5-micron transistors when implementing the analog or mixed-signal functions of the circuit.

However, when 0.25-micron transistors and 0.35 or 0.5-micron devices are utilized in the same circuit, the layer of gate oxide used with the 0.35 or 0.5-micron transistors must be thicker than the layer of gate oxide used with the 0.25-micron transistors due to the higher voltages that are applied to these transistors. Without the thicker layer of gate oxide, the higher voltages, e.g., 3.3 or 5 volts, would prematurely degrade the gate oxide layer of the 0.35 or 0.5-micron transistors.

For example, the thickness of the gate oxide layer used with a 0.25-micron CMOS process is approximately 55 Å, while the thickness of the gate oxide layer used with 0.35 and 0.5-micron CMOS processes ranges from approximately 70 Å to 120 Å.

Thus, to form 0.25-micron transistor types and 0.35 or 0.5-micron transistor types on the same chip requires a process flow which is capable of forming multiple thicknesses of gate oxide. Current processes, however, typically require several additional masking steps to achieve different thicknesses of gate oxide.

Thus, there is a need for a process that forms 2.5-volt CMOS transistors with a thin layer of gate oxide, and 3.3 or 5-volt transistors with a thick layer of gate oxide.

SUMMARY OF THE INVENTION

The present invention provides a cost-effective method for forming low-voltage, e.g., 2.5-volt, CMOS transistors with a thin layer of gate oxide, while also forming high-voltage, e.g., 3.3 or 5.0-volt, CMOS transistors with a thick layer of gate oxide.

The method, which forms the low-voltage MOS transistors in a first area of a semiconductor material, and the high-voltage MOS transistors in a second area of the semiconductor material, begins with the step of forming a layer of first insulation material over the first and second areas. Next, a layer of first conductive material is deposited over the layer of first insulation material, followed by the formation of a layer of dielectric material over the layer of first conductive material.

After the layer of dielectric material has been formed, the layer of dielectric material, the layer of first conductive material, and the layer of first insulation material formed over the second area are removed. Next, a layer of second insulation material is formed over the second area, followed by the deposition of a layer of second conductive material over the layer of dielectric material formed over the first area, and the layer of second insulation material.

Once the layer of second conductive material has been deposited, the layer of second conductive material is removed from the first area, and selectively removed from the second area to form a gate in the second area. Next, the layer of dielectric material and the layer of first conductive material are selectively removed from the first area to form a gate in the first area.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 1A–1G are cross-sectional drawings illustrating a process for forming a CMOS device in accordance with the present invention.

DETAILED DESCRIPTION

Figure 1C:
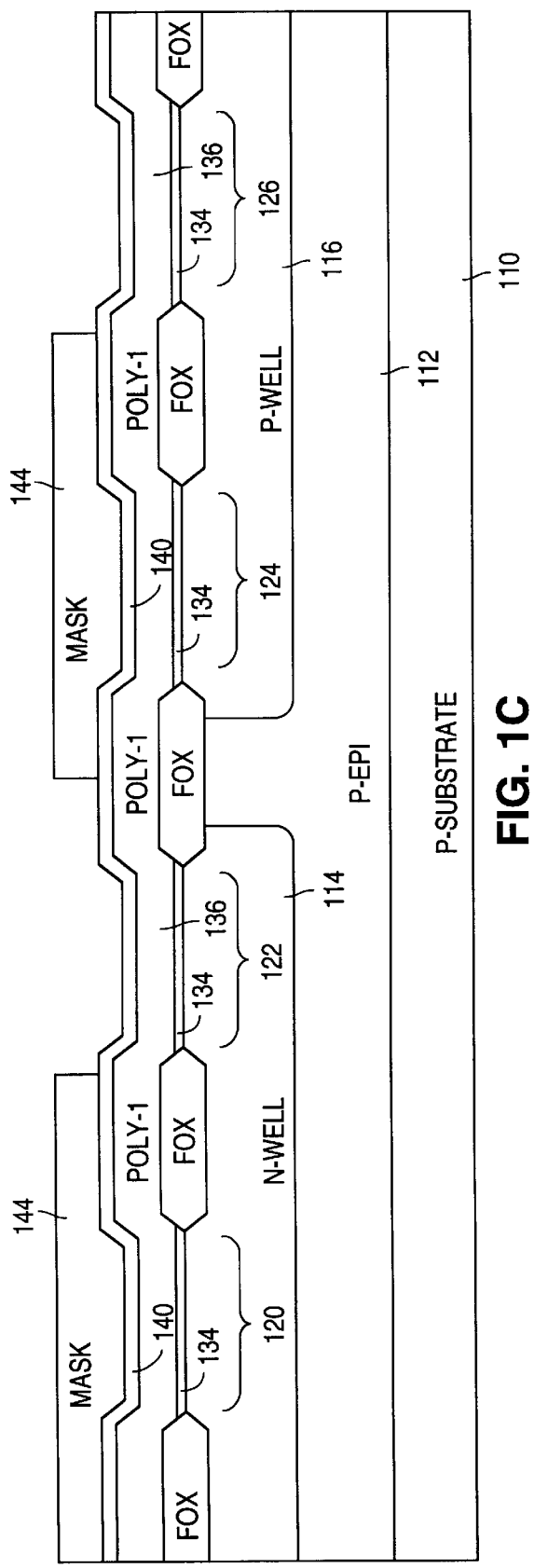

FIGS. 1A–1G show cross-sectional drawings that illustrate a process for forming a CMOS device that has both low-voltage, e.g., 2.5 V, and high-voltage, e.g., 3.3 or 5.0 V surface-channel NMOS transistors, and low-voltage and high-voltage PMOS surface-channel transistors in accordance with the present invention.

As described in greater detail below, the present invention forms 2.5-volt CMOS transistors with a thin layer of gate oxide, while also forming 3.3 or 5-volt CMOS transistors with a thick layer of gate oxide in a process flow that requires only one additional masking step over a conventional double-poly CMOS process.

As shown in FIG. 1A, the process of the present invention, which is described with respect to a 0.25-micron photolithographic process, begins with the conventional formation of a semiconductor device that includes a p+ substrate 110, a p– epi layer 112, and a series of LOCOS-formed field oxide regions FOX. Alternately, rather than forming the devices in a p– epi layer, the devices can also be formed directly in a p– substrate.

Following the conventional formation of the device, a series of implants are next utilized to form n and p wells, inhibit the formation of a punchthrough current, and set the threshold voltages of the to-be-formed transistors.

To form the wells, a layer of sacrificial oxide 130 approximately 100–200 Å thick is first formed over epi layer 112 (or over the p– substrate). Next, a first implant mask 132 is formed and patterned over sacrificial oxide layer 130 to protect the to-be-formed p-well region.

After this, an n-type dopant, such as phosphorous, is implanted into epi layer 112 (or the p– substrate) at an implant energy in the range of 200 KeV to 800 KeV, and a dose in the range of $2\times10^{12}$ to $2\times10^{13}$ atoms/cm$^2$ to form an n-well 114.

Next, using the same mask, an n-type dopant, such as arsenic, is again implanted into n-well 114 at an implant energy in the range of 150 KeV to 250 KeV, and a dose in the range of $2\times10^{12}$ to $2\times10^{13}$ atoms/cm$^2$ to inhibit punchthrough in the to-be-formed PMOS transistors.

Following this, still using the same mask, the n-type dopant, such as arsenic, is once more implanted into n-well 114 at an implant energy in the range of 50 KeV to 100 KeV, and a dose in the range of $1\times10^{12}$ to $5\times10^{12}$ atoms/cm$^2$ to set the threshold voltages of the to-be-formed PMOS transistors. The implant energy and dose of the n-type dopant are defined by the requirements of the low-voltage transistors.

After the threshold voltages of the PMOS transistors have been set, mask 132 is removed and a second implant mask (not shown) is formed and patterned over sacrificial oxide layer 130 to protect n-well 114.

After this, a p-type dopant, such as boron, is implanted into epi layer 112 (or the p– substrate) at an implant energy in the range of 100 KeV to 400 KeV, and a dose in the range of $2\times10^{12}$ to $2\times10^{13}$ atoms/cm$^2$ to form a p-well 116.

Next, using the same mask, the p-type dopant, such as boron, is again implanted into p-well 116 at an implant energy in the range of 30 to 100 KeV, and a dose in the range of $2\times10^{12}$ to $2\times10^{13}$ atoms/cm$^2$ to inhibit punchthrough in the to-be-formed NMOS transistors.

Following this, still using the same mask, the p-type dopant, such as boron, is once more implanted into p-well 116 at an implant energy in the range of 10 KeV to 50 KeV, and a dose in the range of $1\times10^{12}$ to $5\times10^{12}$ atoms/cm$^2$ to set the threshold voltages of the to-be-formed NMOS transistors. The implant energy and dose of the p-type dopant are defined by the requirements of the low-voltage transistors. After this, the second implant mask is stripped, followed by the removal of sacrificial oxide layer 130.

As further shown in FIG. 1A, n-well 114 is defined to have low and high-voltage PMOS regions 120 and 122 where the 2.5 and 3.3 or 5-volt PMOS transistors, respectively, are to be formed, while p-well 116 is defined to have low and high-voltage NMOS regions 124 and 126 where the 2.5 and 3.3 or 5-volt NMOS transistors, respectively, are to be formed.

The above-described process is used to form NMOS and PMOS surface-channel devices. If surface-channel NMOS and buried-channel PMOS transistors are to be formed, separate threshold adjust implants must be performed for the low and high-voltage PMOS transistors which, in turn, requires the use of an additional mask.

Turning now to FIG. 1B, once the layer of sacrificial oxide 130 has been removed, a layer of gate oxide 134 approximately 50–55 Å thick is grown over n-well 114 and p-well 116. Next, a first layer of polysilicon (poly-1) 136 approximately 2,000 Å thick is deposited over gate oxide layer 134, and field oxide regions FOX, followed by the deposition of an overlying layer of oxide-nitride-oxide (ONO) 140.

If the CMOS device requires poly capacitors and resistors, the lower plate of the capacitor and the resistor, which are formed over the field oxide regions FOX from the layer of poly-1, are next doped by first forming and patterning a cap/res implant mask 142 to expose the regions of ONO layer 140 which are formed over poly-1 layer 136 where the poly capacitors and resistors are to be formed.

Next, an n-type dopant, such as arsenic or phosphorous, is implanted into poly-1 layer 136 at an implant energy in the range of 20 KeV to 50 KeV and a dose in the range of $1\times10^{15}$ to $1\times10^{16}$ atoms/cm$^2$. A p-type dopant can also be used, although p-type dopants provide a higher resistivity. After the implant, mask 142 is removed.

If the capacitor can be formed with a less-than-optimum quality factor, poly-1 layer 136 can be blanket implanted with a lower dose immediately after poly-1 layer 136 has been deposited (thereby eliminating the need for mask 142). The lower dose, however, must be approximately one order of magnitude lower than the dose that will subsequently be used to form the source and drain regions and implant the gate to insure that both the NMOS and PMOS transistors are surface-channel transistors.

For example, if poly-1 layer 136 is blanket implanted with an n-type dopant, the dose must be approximately one order of magnitude less than the dose of the p-type dopant which will be subsequently implanted to dope the gate of the PMOS transistors to ensure that the polysilicon gate of the PMOS transistor is completely converted from an n-type to a p-type, especially at the poly-to-gate oxide interface.

In addition, if surface-channel NMOS and buried-channel low-voltage PMOS transistors are to be formed, an n-type dopant may also be blanket implanted into poly-1 layer 136 immediately after the layer of poly-1 136 has been deposited. However, as noted above, if buried-channel PMOS transistors are to be formed, separate implants must be performed for the low and high-voltage PMOS transistors.

Turning now to FIG. 1C, after poly-1 layer 136 has been doped and mask 142 has been removed, a gate oxide etch (GOX2) mask 144 is formed and patterned over ONO layer 140 to expose the regions of layer 140 which are formed over the high-voltage NMOS and PMOS regions 122 and 126.

After this, the exposed regions of ONO layer 140, underlying poly-1 layer 136, and underlying gate oxide layer 134 are etched away in a multi-step etch process that utilizes conventional etch chemistries. Following this, mask 144 is removed.

Figure 1D:
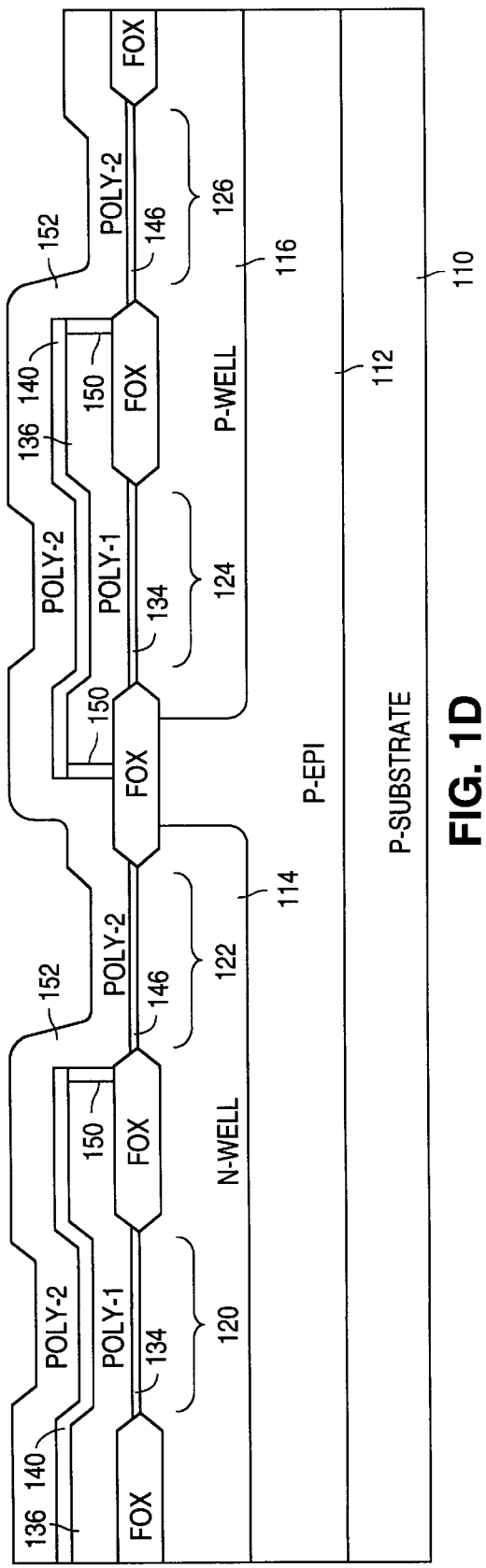

Turning now to FIG. 1D, once gate oxide layer 134 has been removed from the high-voltage NMOS and PMOS regions 122 and 126, a layer of gate oxide 146 approximately 70–120 Å thick is grown over the exposed regions of n-well 114 and p-well 116.

The exact thickness of gate oxide layer 146 depends on the desired operating voltage of the high-voltage MOS transistors, the breakdown requirements, and the doping of wells 114 and 116. A thicker gate oxide layer, up to some extent, translates to higher operating voltages and higher threshold voltages. As a result, the threshold voltage increases with the increasing thickness of the gate oxide layer.

Alternately, the thickness of gate oxide layer 134 can be increased after the overlying layer of poly-1 has been removed by growing an additional 20–70 Å of oxide in lieu of growing a new layer of oxide. This approach, however, typically produces a lower quality of gate oxide that has a much higher defect density.

After gate oxide layer 146 has been grown, which also forms sidewall oxide 150 on the etched ends of poly-1 layer 136, a second layer of polysilicon (poly-2) 152 approximately 2,000 Å thick is deposited over ONO layer 140, gate oxide layer 146, sidewall oxide 150, and field oxide regions FOX.

One of the advantages of the present invention is that the poly-1 and poly-2 layers 136 and 152 are deposited on the layers of gate oxide 134 and 146 immediately after the layers of gate oxide 134 and 146 have been formed. This approach seals the oxide which prevents process-related contamination, thereby lowering the defect density of the oxide layers 134 and 146.

Figure 1E:
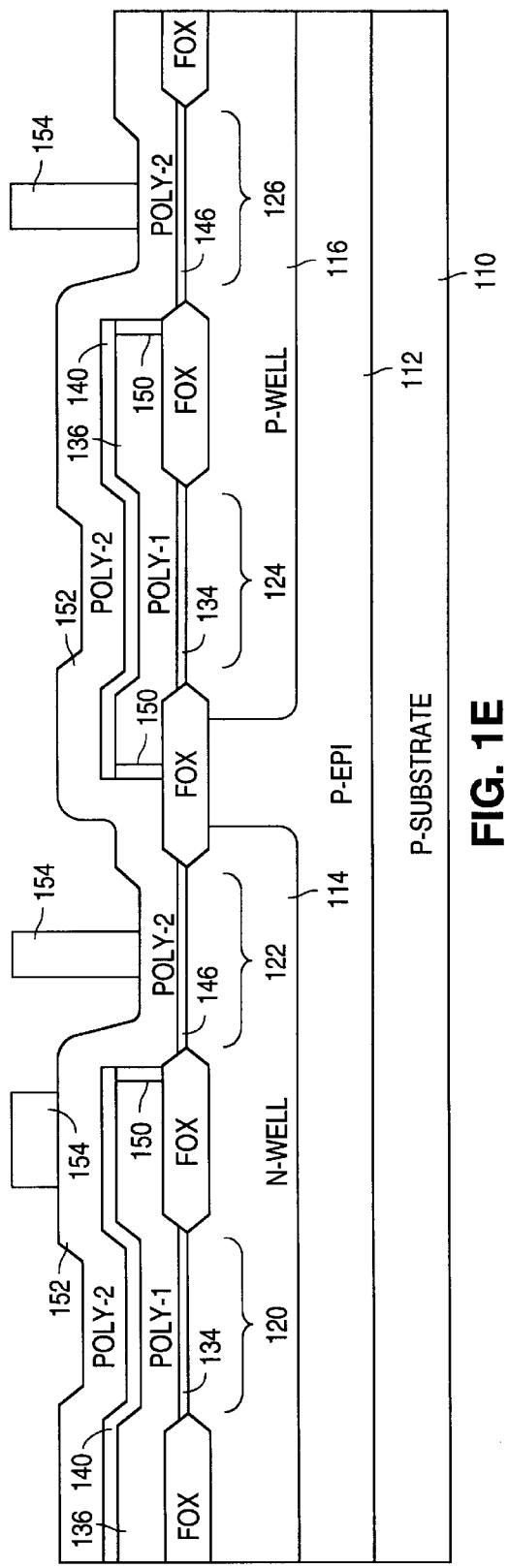

Next, as shown in FIG. 1E, a poly-2 mask 154 is formed and patterned over poly-2 layer 152 to define the upper plates 156 (see FIG. 1F) of the poly capacitors and the gates 158 (see FIG. 1F) of the high-voltage NMOS and PMOS transistors.

After poly-2 mask 154 has been formed, poly-2 layer 152 is anisotropically etched to remove the unmasked regions of poly-2 layer 152. After the etch of poly-2 layer 152 has been completed, mask 154 is removed.

Figure 1F:
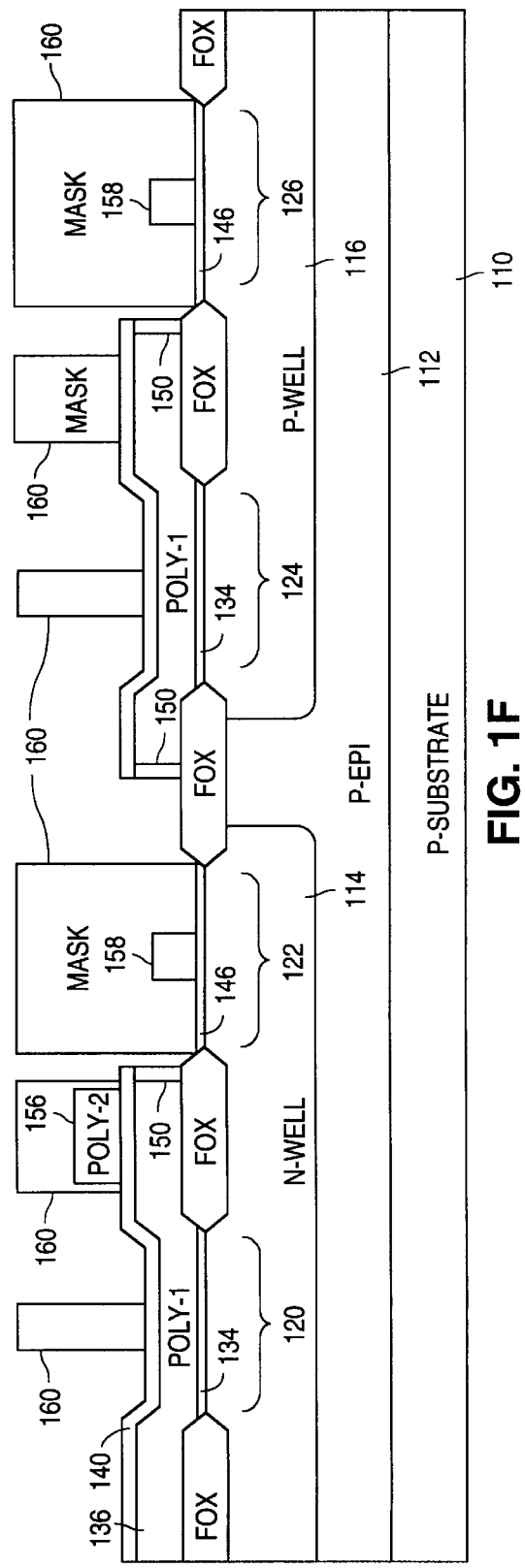
Figure 1G:
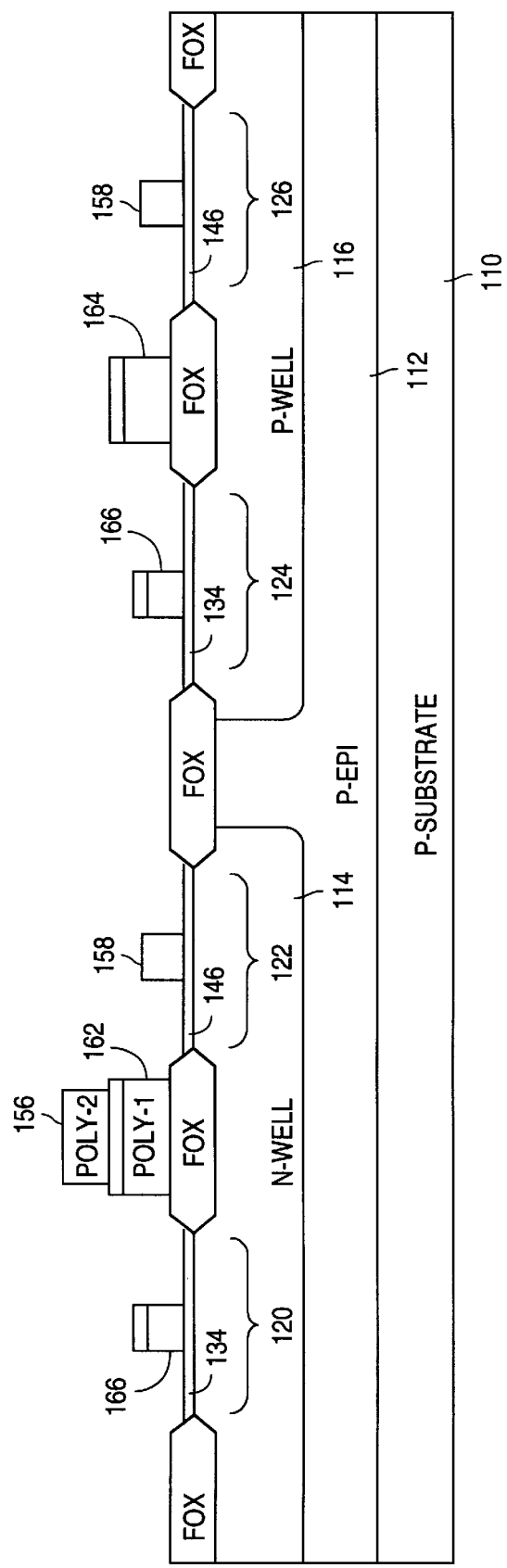

Turning now to FIG. 1F, a poly-1 mask 160 is next formed and patterned over poly-1 layer 136 to define the lower plates 162 (see FIG. 1G) of the poly capacitors, the resistors 164 (see FIG. 1G), and the gates 166 (see FIG. 1G) of the low-voltage NMOS and PMOS transistors, and to protect the high-voltage NMOS and PMOS regions 122 and 126. Next, the unmasked regions of ONO layer 140 and the underlying poly-1 layer 136 are etched away in a multi-step etch process that utilizes conventional chemistries. After this, mask 160 is removed. FIG. 1G shows a cross-sectional diagram that illustrates the resulting wafer after mask 160 has been removed.

Once mask 160 has been removed, standard CMOS process steps follow starting with the growth of a layer of poly seal oxide (not shown) over all of the exposed regions of polysilicon to seal the exposed polysilicon. Following this, the process continues with conventional CMOS processing steps which include the formation of LDD regions, oxide spacers, source and drain regions, contacts, vias, and metal layers. The LDD structures which are optimized for the low-voltage MOS transistors can also be used with the high-voltage MOS transistors in less than optimal configurations.

Since both low and high-voltage surface-channel NMOS and PMOS transistors are formed by the present process, the gates of all of the transistors are doped at the same time that the source and drain regions are formed. If, however, surface-channel NMOS transistors and buried-channel PMOS transistors are to be formed (both low and high-voltage NMOS transistors are always formed to be surface-channel transistors), the polysilicon gates are heavily n-type doped following the deposition of poly-1 layer 136 (for the low-voltage PMOS transistors) and/or poly-2 layer 152 (for the high-voltage PMOS transistors).

Thus, a process has been described for forming 2.5-volt transistors with a thin layer of gate oxide, 3.3 or 5-volt MOS transistors with a thick layer of gate oxide, poly resistors, and double-poly capacitors in a single integrated CMOS process flow.

One of the advantages of the present invention that results from forming both NMOS and PMOS surface-channel transistors is that the threshold voltages of both the low and high-voltage PMOS transistors are set with one n-type implant, while the threshold voltages of both the low and high-voltage NMOS transistors are set with one p-type implant.

As a result, the present process eliminates the extra masking steps which are required to set the threshold voltages when buried-channel PMOS transistors are utilized. As noted above, the present invention can also support the formation of low and high-voltage buried-channel PMOS transistors by using a separate mask and implant.

Another advantage of the present invention is that it preserves the symmetry (or asymmetry) of the threshold voltages of the low and high-voltage MOS transistors. For example, if the threshold voltages of the low-voltage MOS transistors are +/−0.5 volts, then the thicker layer of gate oxide extends the symmetry of the threshold voltages in absolute terms to the high-voltage MOS transistors to, for example, +/−0.8 volts.

Higher threshold voltages are of particular significance to analog circuits where low threshold voltages are associated with higher leakage currents (when the transistors are in the OFF state). Higher leakage currents can be tolerated in many digital circuits. Most analog circuits, however, have no tolerance to high leakage currents as discussed before.

A further advantage of the present invention is that the process flow only requires one additional masking step over the steps required by a conventional double-poly CMOS process flow, namely the GOX2 mask 144 that is utilized to remove the layer of ONO 140, the layer of poly-1 136, and the layer of gate oxide 134 from the high-voltage regions 122 and 126.

Conventional double-poly CMOS processes, which typically use a second layer of poly to form poly—poly capacitors, require a mask at each of the other remaining steps where the present process also requires a mask.

An additional advantage of the present invention is that control of the poly-2 masking step is not as critical as that for the poly-1 masking step. In the present invention, the low-voltage transistors are scaled-down versions of the high-voltage transistors. As a result, the lengths of the gates of the high-voltage transistors are greater than the lengths of the gates of the low-voltage transistors. Thus, the poly-2 masking step does not represent an expensive critical masking step as does the poly-1 masking step.

The present invention accounts for the potentially troubling poly spacers which are formed following the anisotropic etch of poly-2 layer 152 by removing these spacers during the poly-1 etch. When poly-2 layer 152 is etched, poly spacers (not shown) are formed adjacent to each of the sidewall oxide 150. Most of these spacers, however, will be etched during the initial stages of the subsequent poly-1 etch.

A number of alternatives to the process flow discussed above are readily apparent. For example, rather than forming cap/res implant mask 142 on ONO layer 140, implant mask 142 can instead be formed on poly-1 layer 136, followed by the implantation of the n-type dopant and the removal of mask 142. In this case, ONO layer 142 is deposited on poly-1 layer 136 after mask 142 has been removed.

In addition, if only poly resistors are required by the CMOS device, the resistors can be implanted during the same mask and implant step that is used to implant the capacitors and resistors or, alternately, during the same implant step that is used to form the source and drain regions, and implant the gates of the transistors. Implanting the resistors at this stage, however, will lead to resistors with a resistivity that is too low for some applications.

Further, if salicide is to be used, which is common to most processes at these feature sizes, a salicide exclusion process must be used with the poly resistors. The resistors must therefore be implanted prior to using the salicide exclusion process since the source and drain implants are usually too shallow to adequately dope the resistors.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method for forming a first transistor in a first area of a semiconductor material and a second transistor in a second area of the semiconductor material, the method comprising the steps of:

forming a layer of first insulation material over the first and second areas;

depositing a layer of first conductive material over the layer of first insulation material;

forming a layer of dielectric material over the layer of first conductive material;

removing the layer of dielectric material, the layer of first conductive material, and the layer of first insulation material formed over the second area;

forming a layer of second insulation material over the second area;

depositing a layer of second conductive material over the layer of dielectric material formed over the first area, and the layer of second insulation material;

removing the layer of second conductive material from the first area, and selectively removing the layer of second conductive material from the second area to form a gate in the second area; and selectively removing the layer of dielectric material and the layer of first conductive material from the first area to form a gate in the first area.

2. The method of claim 1 and further comprising the step of forming a field oxide region between the first and second areas prior to forming the layer of first insulation material, the layer of first conductive material being formed over the field oxide region when the layer of first conductive material is deposited, the layer of dielectric material being formed over the layer of first conductive material and the field oxide region when the layer of dielectric material is formed.

3. The method of claim 2 and further comprising the step of implanting a dopant into the layer of first conductive material formed over the field oxide region prior to removing the layer of dielectric material, the layer of first conductive material, and the layer of first insulation material from the second area.

4. The method of claim 3 wherein the layer of second conductive material is formed over the layer of dielectric material and the layer of first conductive material formed on the field oxide region when the layer of second conductive material is deposited.

5. The method of claim 4 wherein the layer of second conductive material formed over the field oxide region is selectively removed to form a top plate of a poly capacitor when the layer of second conductive material is removed from the first area, and selectively removed from the second area to form the gate in the second area.

6. The method of claim 5 wherein the layer of dielectric material and the first conductive layer formed over the field oxide region are selectively removed to form a dielectric and a bottom plate of the poly capacitor, respectively, when the layer of dielectric material and the layer of first conductive layer are selectively removed from the first area to form the gate in the first area.

7. The method of claim 4 wherein the layer of second conductive material formed over the field oxide region is removed when the layer of second conductive material is removed from the first area, and selectively removed from the second area to form the gate in the second area.

8. The method of claim 7 wherein the layer of dielectric material and the layer of first conductive material formed over the field oxide region are selectively removed to form a poly resistor when the layer of dielectric material and the layer of first conductive material are selectively removed from the first area to form the gate in the first area.

9. The method of claim 1 wherein the layer of first insulation material and the layer of second insulation material have different thicknesses.

10. The method of claim 1 wherein the layers of first and second insulation material are formed from oxide.

11. The method of claim 1 wherein the layers of first and second conductive material are formed from doped polysilicon.

12. The method of claim 1 wherein the layer of dielectric material is formed from a composite layer of oxide-nitride-oxide.

13. The method of claim 2 and further comprising the step of implanting a dopant into the layer of first conductive material so that the dopant is only implanted into a region that is formed over the field oxide region prior to removing the layer of dielectric material, the layer of first conductive material, and the layer of first insulation material from the second area.

* * * * *